（12）United States Patent
Park et al.

(10) Patent No.: US 10,331,819 B2
(45) Date of Patent: Jun. 25, 2019

(54) SYSTEM, METHOD AND READABLE RECORDING MEDIUM OF CONTROLLING VIRTUAL MODEL (71) Applicants: KOREA INSTITUTE OF SCIENCE AND TECHNOLOGY, Seoul (KR); CENTER OF HUMAN-CENTERED INTERACTION FOR COEXISTENCE, Seoul (KR)

(72) Inventors: Jung Min Park, Seoul (KR); Joongjae Lee, Seoul (KR); Jisu Kim, Seoul (KR)

(73) Assignees: Korea Institute of Science and Technology, Seoul (KR); Center of Human-Centered Interaction for Coexistence, Seoul (KR)

( * ) Notice: Subject to any disclaimer, the term of this patent is extended or adjusted under 35 U.S.C. 154(b) by 0 days.

(21) Appl. No.: 15/616,879

(22) Filed: Jun. 7, 2017

(65) Prior Publication Data

US 2018/0046738 A1 Feb. 15, 2018

(30) Foreign Application Priority Data

Aug. 10, 2016 (KR) .......................... 10-2016-0101676

(51) Int. Cl.
G06T 19/00 (2011.01)
G06F 17/50 (2006.01)
G06F 3/01 (2006.01)

(52) U.S. Cl.
CPC .......... *G06F 17/5009* (2013.01); *G06F 3/011* (2013.01); *G06T 19/006* (2013.01)

(58) Field of Classification Search
None
See application file for complete search history.

(56) References Cited

U.S. PATENT DOCUMENTS 6,166,732 A * 12/2000 Mitchell ................ G06F 9/465
715/733
8,243,064 B1 8/2012 Moravanszky et al.
(Continued)

FOREIGN PATENT DOCUMENTS

JP 2012-247950 A 12/2012
KR 10-2010-0032267 A 3/2010
(Continued)

OTHER PUBLICATIONS

Ballantyne et al., "Collision Overload: Reducing the Impact in Real-time Physics", 2007 (Year: 2007).*
(Continued)

*Primary Examiner* — Xiao M Wu
*Assistant Examiner* — Steven Z Elbinger
(74) *Attorney, Agent, or Firm* — Rabin & Berdo, P.C.

(57) ABSTRACT

A method of controlling a virtual model to perform physics simulation to the virtual model in a virtual space includes: generating a first virtual model having a first object physics field which is a range with respect to a first field parameter; generating a second virtual model having a second object physics field which is a range with respect to a second field parameter; when the field parameters are capable of corresponding to each other, checking whether there is a portion where the object physics fields correspond to each other; and when there is a portion where the object physics fields correspond to each other, generating an interaction of the virtual models.

10 Claims, 9 Drawing Sheets (56) References Cited

U.S. PATENT DOCUMENTS

| | | |
|---|---|---|
| 8,284,197 B2 | 10/2012 | Barczak |
| 8,554,526 B2 | 10/2013 | Andersen et al. |
| 9,581,997 B1* | 2/2017 | Penilla ................. G05D 1/0011 |
| 9,984,510 B1* | 5/2018 | Kinstner ............... G06T 19/006 |
| 2009/0219286 A1* | 9/2009 | Wei ....................... G06T 15/005 |
| | | 345/424 |
| 2013/0158965 A1* | 6/2013 | Beckman ............ G06F 17/5009 |
| | | 703/6 |
| 2015/0051000 A1* | 2/2015 | Henn ..................... A63F 13/35 |
| | | 463/42 |
| 2015/0067377 A1* | 3/2015 | Park ..................... G06F 1/3212 |
| | | 713/340 |
| 2016/0196687 A1* | 7/2016 | Alpert ..................... G06T 17/05 |
| | | 345/419 |
| 2017/0018119 A1 | 1/2017 | Kim et al. |

FOREIGN PATENT DOCUMENTS

| | | |
|---|---|---|
| KR | 10-2011-0033864 A | 3/2011 |
| KR | 10-1639066 B1 | 7/2016 |

OTHER PUBLICATIONS

Carol O'Sullivan et al., "Collisions and Perception", ACM Transactions on Graphics, Jul. 2001, pp. 151-168, vol. 20, No. 3.
Ian Robert Ballantyne et al., "Collision Overload: Reducing the Impact in Real-time Physics", 2007.

\* cited by examiner

SYSTEM, METHOD AND READABLE RECORDING MEDIUM OF CONTROLLING VIRTUAL MODEL

CROSS-REFERENCE TO RELATED APPLICATION

This application claims priority to Korean Patent Application No. 10-2016-0101676, filed on Aug. 10, 2016, and all the benefits accruing therefrom under 35 U.S.C. § 119, the contents of which in its entirety are herein incorporated by reference.

BACKGROUND

1. Field

The present disclosure relates to a system, method and computer-readable recording medium of controlling a virtual model, and more particularly, to a system, method and computer-readable recording medium of determining whether or not to perform physics simulation to a virtual model and determining a simulation level of detail (LOD) when physics simulation is performed to the virtual model formed in a virtual space.

DESCRIPTION ABOUT NATIONAL RESEARCH AND DEVELOPMENT SUPPORT

This study was supported by the Global Frontier Project of Ministry of Science, ICT and Future Planning, Republic of Korea (Project No. 1711041569) under the superintendence of National Research Foundation of Korea.

2. Description of the Related Art

Recently, various kinds of electronic devices and software associated with virtual reality and augmented reality are being developed. In the virtual reality and augmented reality, a user may feel as if the user is in a virtual space, by means of an interaction between the user and a virtual model or between virtual models.

In order to perform physics simulation to a virtual model generated in a virtual space, a physics engine is used. By means of the physics simulation using a physics engine, a user may experience more natural and realistic virtual space.

In the virtual space, numerous virtual models are present. When facing the virtual models, a user does not give the same attention and interest on every virtual model, as in the real world. In this point of view, if precise physics simulation is performed to all virtual models in the entire virtual space, the amount of calculation accompanied by the simulation increases greatly, which lowers the performance of physics simulation inefficiently.

To solve this problem, a method of controlling a virtual model is being studied in various ways. First, virtual models to which physics simulation is to be performed and models to which physics simulation is not to be performed may be separated based on objects in a virtual space. Also, a shape of a virtual model may be simplified and then physics simulation may be performed thereto.

In these methods, since the shape of a virtual model is simplified, the level of detail (LOD) of the physics simulation is lowered, and once the LOD is set, the LOD is not easily changed, which is not so good in flexibility.

In addition, a process for reducing the amount of calculation like a Havok engine may be included in the physics engine. In this case, as the physics engine is changed, the performance and speed of the physics simulation are also changed.

Therefore, there is demanded a method of controlling a virtual model, which may use a physics engine intensively to a space where physics simulation is required, with a limited amount of calculation, and may also be flexibly applied depending on circumstances.

SUMMARY

The present disclosure is directed to providing a system, method and computer-readable recording medium of controlling a virtual model, which may flexibly control the virtual model not only before performing simulation but also while performing simulation, by determining whether or not to perform physics simulation to the virtual model according to a relation between an object field and an environment field and determining a simulation level of detail (LOD) of the physics simulation according to a relation of object fields or the like.

In one aspect of the present disclosure, there is provided a computer-readable recording medium, which comprises commands for executing a method of controlling a virtual model, the method comprising: generating a first virtual model having a first object physics field which is a range with respect to a first field parameter; generating a second virtual model having a second object physics field which is a range with respect to a second field parameter; when the field parameters are capable of corresponding to each other, checking whether there is a portion where the object physics fields correspond to each other; and when there is a portion where the object physics fields correspond to each other, generating an interaction of the virtual models.

According to an embodiment of the present disclosure, meshes of the virtual models may be selected from at least one mesh corresponding to at least one preset level of detail (LOD), and the method may further comprise changing a mesh of at least one virtual model among the virtual models according to a LOD which is determined in consideration of the portion where the object physics fields overlaps each other.

According to an embodiment of the present disclosure, the meshes of the virtual models may be closer to an original shape of the virtual models as the LOD is higher.

According to an embodiment of the present disclosure, the first field parameter and the second field parameter may be distances from a center point of each virtual model, and the object physics fields may be spaces located from the center point of each virtual model to a maximum distance.

According to an embodiment of the present disclosure, the LOD may be determined higher when there is a portion where the object physics fields overlap each other, in comparison to a case where there is no portion where the object physics fields overlap each other.

According to an embodiment of the present disclosure, the LOD may be determined higher as a portion where the object physics fields overlap each other is greater.

According to an embodiment of the present disclosure, the first field parameter may be complexity resulting by moving the first virtual model, and the second field parameter may be complexity of an available motion of the second virtual model.

According to an embodiment of the present disclosure, the first virtual model may have a plurality of first object physics fields according to a range with respect to a plurality of first field parameters, the second virtual model may have a plurality of second object physics fields according to a range with respect to a plurality of second field parameters, and a priority may be set to each object physics field, so that the LOD is determined according to overlapping of an object physics field having a high priority.

According to an embodiment of the present disclosure, an environmental physics field to which physics simulation is performed may be set in the virtual space, and as the virtual models enter the environmental physics field, each object physics field may be activated to allow physics simulation with respect to the virtual models.

According to an embodiment of the present disclosure, the environmental physics field may be movable and modifiable.

According to an embodiment of the present disclosure, the mesh may have a mesh parameter, and during a transition region where the mesh is changing, the mesh parameter may be calculated by adding a value obtained by multiplying a mesh parameter before the change by a gradually decreasing weight and a value obtained by multiplying a mesh parameter after the change by a gradually increasing weight.

According to an embodiment of the present disclosure, the first virtual model may have a plurality of first object physics fields according to a range with respect to a plurality of first field parameters, the second virtual model may have a plurality of second object physics fields according to a range with respect to a plurality of second field parameters, and in case a part of the first field parameters and a part of the second field parameters correspond to each other and thus the object physics fields overlap each other, when the other first field parameters and the other second field parameters do not correspond to each other, or when the object physics fields do not overlap each other even though the other first field parameters and the other second field parameters correspond to each other, an interaction of the virtual models may not be generated.

In another aspect of the present disclosure, there is provided a system of controlling a virtual model to perform physics simulation to the virtual model in a virtual space, the system comprising: a virtual model generating module configured to generate a virtual model having an object physics field which is a range with respect to a field parameter; a field checking module configured to check whether there is a portion where a plurality of object physics fields of corresponding field parameters correspond to each other; and an interaction generating module configured to generate an interaction of a plurality of virtual models, wherein the virtual model generating module generates a first virtual model having a first object physics field which is a range with respect to a first field parameter and a second virtual model having a second object physics field which is a range with respect to a second field parameter, and wherein when the field parameters are capable of corresponding to each other and a portion where the object physics fields correspond to each other is checked by means of the field checking module, the interaction generating module generates an interaction of the virtual models.

In another aspect of the present disclosure, there is provided a method of controlling a virtual model to perform physics simulation to the virtual model in a virtual space, comprising: generating a first virtual model having a first object physics field which is a range with respect to a first field parameter; generating a second virtual model having a second object physics field which is a range with respect to a second field parameter; when the field parameters are capable of corresponding to each other, checking whether there is a portion where the object physics fields correspond to each other; and when there is a portion where the object physics fields correspond to each other, generating an interaction of the virtual models.

According to the present disclosure, a calculation speed of physics simulation may be controlled regardless of a physics engine, an amount of calculation may be flexibly reduced while physics simulation is being performed, and the level of detail (LOD) felt by a user may be improved by intensively performing physics simulation to an interested region of the user.

DETAILED DESCRIPTION

Advantages and features of the present disclosure and their solutions will be more apparent from the following detailed description and embodiments taken in conjunction with the accompanying drawings. However, the present disclosure is not limited to the embodiments disclosed below but may be implemented in various ways, and the embodiments are just for more perfect disclosure and better understanding to those having ordinary skilled in the art. The present disclosure is defined just by the scope of the appended claims.

Shapes, sizes, ratios, angles, numbers or the like depicted in the drawings to explain an embodiment of the present disclosure are just for illustrations, and the present disclosure is not limited thereto. In addition, in the description, details of well-known features and techniques may be omitted to avoid unnecessarily obscuring the presented embodiments. When the terms "comprises" and/or "comprising", or "includes" and/or "including" are used in this specification, this means any other component can also be added, unless stated otherwise. As used herein, the singular forms "a", "an" and "the" are intended to include the plural forms as well, unless the context clearly indicates otherwise.

When interpreting a component, it should be understood as including an error range, even though there is no explicit statement.

In case of location-related explanation, for example if a location relation of two components is explained using the terms "on", "above", "below", "beside" or the like, at least one other component may be further located between two components, unless any restrictive term such as 'instantly' or 'directly' is used.

When an electrode or layer is explained as being located "on" another element or layer, this includes all cases where another layer or element is interposed therebetween. Throughout the specification, like reference numerals denote like elements.

Though the terms "first" and "second" are used for explaining various components, these components are not limited thereto. These terms are just used for distinguishing any component from another. Therefore, any "first component" recited below may also be regarded as a second component within the scope of the present disclosure.

The size and thickness of each component in the drawings are just for convenient explanation, and the present disclosure is not limited to the depicted size and thickness.

Features of various embodiments of the present disclosure may be united or combined with each other partially or entirely. As fully understood by those skilled in the art, such features may be technically linked or operated together in various ways, and various embodiments may be implemented independently or together in an associated way.

Hereinafter, a system of controlling a virtual model according to an embodiment of the present disclosure will be described with reference to the drawings.

Figure 1:
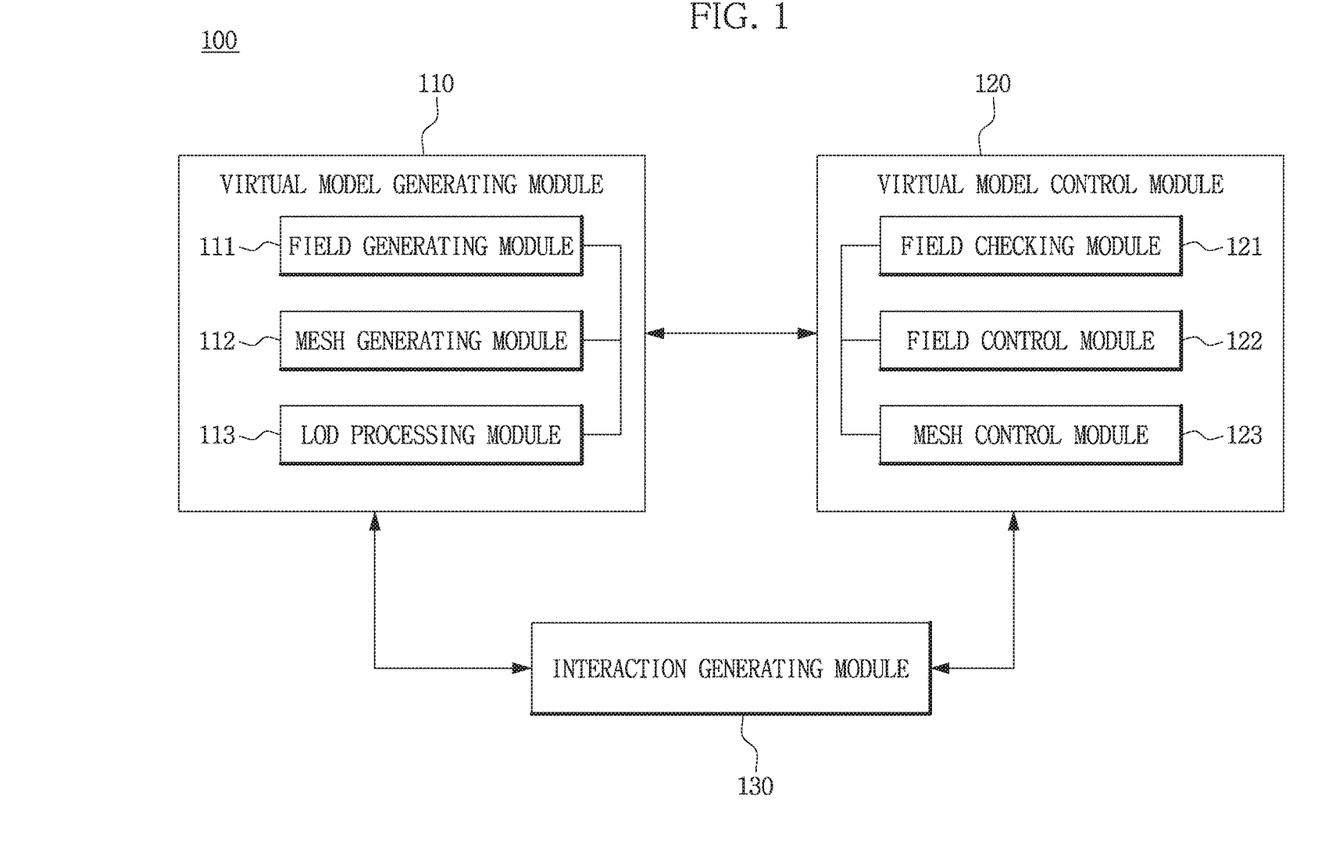
FIG. 1 is a schematic view showing a system of controlling a virtual model according to an embodiment of the present disclosure.

Referring to FIG. 1, a system 100 of controlling a virtual model includes a virtual model generating module 110, a virtual model control module 120, and an interaction generating module 130.

The virtual model generating module 110 generates a virtual model which is an object in a virtual space. The information for generating the virtual model may be separately generated by a user by means of modeling, or may be transmitted from an external input device (not shown) which is capable of recognizing an article and its motion in a real space. The virtual model generating module 110 may freely generate a virtual model in a virtual space in various ways known in the art.

The virtual model generating module 110 includes a field generating module 111, a mesh generating module 112, and a LOD (level of detail) processing module 113.

The field generating module 111 generates an object physics field corresponding to each virtual model. In other words, the virtual model has an inherent object physics field. The object physics field is a range with respect to a field parameter which represents a characteristic of the object physics field. The field parameter may employ any one of various physics parameters known in the art. In addition, the field parameter may a parameter arbitrarily set by a user. The object physics field representing a characteristic of the virtual model determines an interaction between the virtual model and another virtual model, determines whether or not to perform physics simulation accordingly, and determines detailed simulation information.

The mesh generating module 112 generates a mesh of each virtual model. The mesh forms the virtual model and becomes a substantial target when an independent motion or interaction is made. The generated mesh may be corrected or modified by a mesh control module 123, explained later.

Meanwhile, the mesh generating module 112 may generate a plurality of meshes for a single virtual model. However, the plurality of meshes of a virtual model may be generated in different forms depending on the level of detail (LOD) of the meshes. If the LOD processing module 113 determines the LOD of the mesh required for performing physics simulation to the virtual model, the mesh of the corresponding virtual model is determined according to the determined LOD.

The virtual model control module 120 controls movement, modification or the like of virtual models generated by the virtual model generating module 110.

The virtual model control module 120 includes a field checking module 121, a field control module 122, and a mesh control module 123.

The field checking module 121 checks whether the plurality of virtual models respectively correspond to the object physics fields, in order to determine an interaction between the virtual models and also determine whether or not to perform physics simulation accordingly. The field checking module 121 checks whether there is a portion where the plurality of object physics fields correspond to each other with respect to corresponding field parameters. If the field checking module 121 checks that the field parameters are capable of corresponding to each other and there is a portion whether object physics fields correspond to each other, the interaction generating module 130 generates an interaction of the virtual models, and physics simulation may be performed therefor.

The field control module 122 controls motions, modifications or the like of fields respectively corresponding to the virtual models, before the virtual models move or while the virtual models are moving. In particular, the field control module 122 may control a motion, modification or the like of a field according to an interaction with another virtual model.

The mesh control module 123 controls a motion, modification or the like of a mesh corresponding to each virtual model, before the virtual model moves or while the virtual model is moving. The mesh control module 123 controls a motion, modification or the like of a mesh according to an interaction with another virtual model. In addition, if it is possible that the virtual model makes an interaction together with another virtual model, each of the virtual models in the virtual space may be compared with each object physics field, so that the mesh is moved or modified according to a necessary LOD of the mesh.

The interaction generating module 130 generates an interaction of the virtual models for performing physics simulation, by means of the virtual models generated by the model generating module 110 and controlled by the virtual model control module 120.

By using the system 100 of controlling a virtual model according to an embodiment of the present disclosure, physics simulation may be performed by controlling virtual models generated in a virtual space to generate an interaction.

Hereinafter, a method of controlling a virtual model according to another embodiment of the present disclosure to control a virtual model by using the system of controlling a virtual model as described above will be described.

Figure 2:
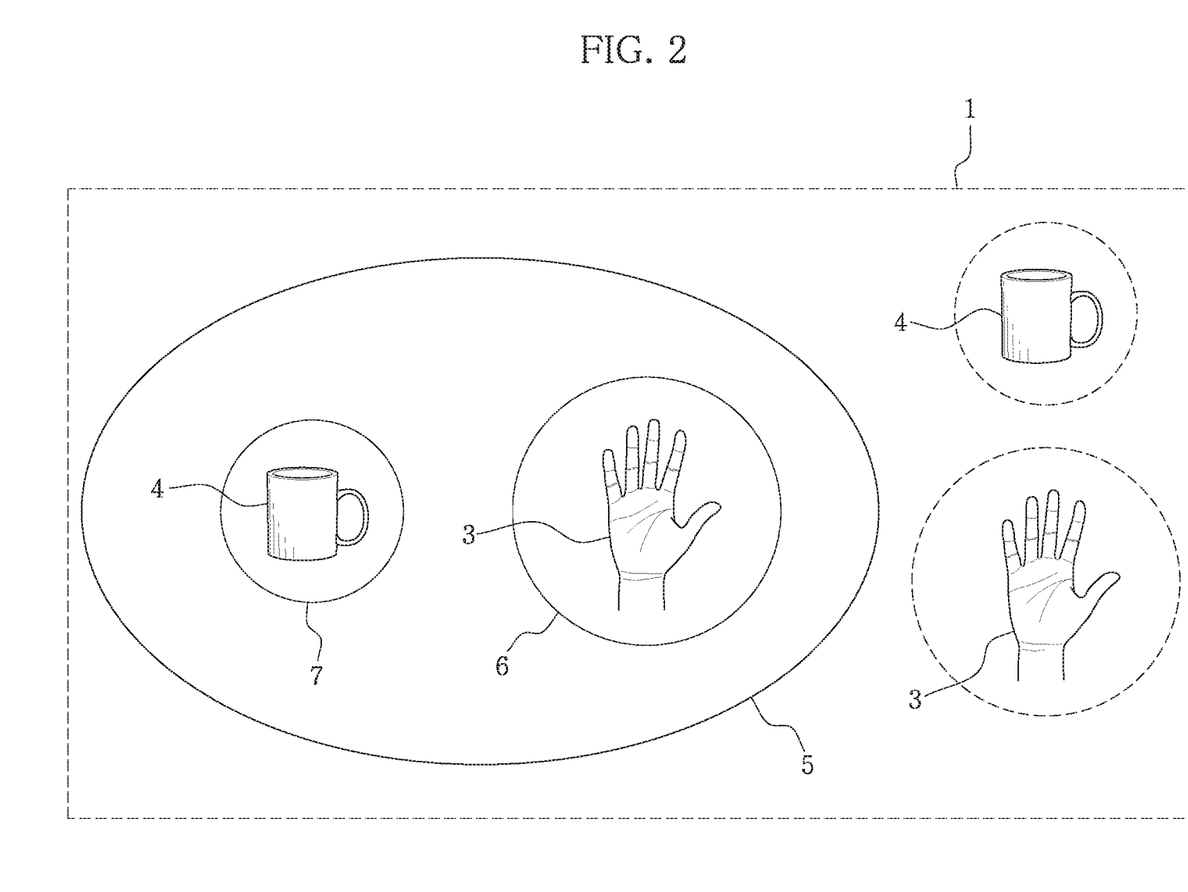
FIG. 2 is a schematic view showing a virtual space in which objects respectively having physics fields and an environmental physics field are formed.

Referring to FIG. 2, a virtual hand model (a first virtual model) 3 and a virtual cup model (a second virtual model) 4 are present in a virtual space 1. In addition, an environmental physics field 5 to which physics simulation is performed is generated in the virtual space 1, and a hand physics field (a first object physics field) 6 and a cup physics field (a second object physics field) 7 are respectively generated in the virtual hand model 3 and the virtual cup model 4.

The virtual space 1 is a three-dimensional space of which each point has an inherent coordinate value in any coordinate system. Depending on the user setting, the virtual space 1 may be formed as a space with various conditions. For example, compared with a real space, the virtual space 1 may have a different gravity, or several kinds of forces such as a frictional force and a deflecting force may be discounted therein.

A user may generate the environmental physics field 5 by using a partial region of the virtual space 1 for performing physics simulation with a physics engine. For example, as an object enters the environmental physics field 5, physics simulation is performed to the entering object.

Physics simulation is not performed to objects present in the virtual space 1 out of the environmental physics field 5. The objects out of the environmental physics field 5 may move according to preset rules, individually.

The environmental physics field 5 may be moved in real time, expanded, shrunken or modified. For example, if a user sets a space observed at his/her vision field as the environmental physics field 5, the environmental physics field 5 is changed in real time according to the movement of the user. In this case, physics simulation is performed only to a space observed by the vision of the user, and thus the amount of calculation is greatly reduced.

In other words, the user may perform physics simulation only in the environmental physics field 5, which is a fixed or variable partial region of the entire virtual space 1, by using a physics engine, and the other regions may be discounted.

Meanwhile, even though it has been described that the environmental physics field 5 is a partial region of the virtual space 1 and thus has a property of space, the environmental physics field 5 may also have a property with respective to another parameter, which may correspond to the virtual space 1 and the virtual models, as explained later. In other words, even though it has been described that the virtual space 1 and the environmental physics field 5 are set as three-dimensional coordinate ranges, it should be understood that they can also be set by means of a range of another parameter.

The virtual models 3, 4 formed in the virtual space 1 have object physics fields 6, 7, respectively. The virtual hand model 3 has a hand physics field 6, and the virtual cup model 4 has a cup physics field 7.

The object physics fields 6, 7 are activated when corresponding to the environmental physics field 5. For example, as shown in FIG. 2, the object physics fields 6, 7 may be activated when overlapping the environmental physics field 5, and be inactivated when deviating from the environmental physics field 5.

As the object physics fields 6, 7 are activated, the virtual models 3, 4 are respectively subject to physics simulation. As described above, as the virtual models 3, 4 enters the region of the environmental physics field 5, the object physics fields 6, 7 are activated as targets for physics simulation, and thus physics simulation is also performed to the virtual models 3, 4.

In other words, the object physics fields 6, 7 are set as a range of factor which determines whether or not to perform physics simulation to the corresponding virtual models 3, 4. This factor may be one or more parameters which correspond between fields. As described above, the physics fields 6, 7 may be set according to a range of at least one preset parameter.

In this embodiment, regions formed in predetermined ranges from the virtual models 3, 4 are set as the object physics fields 6, 7 respectively corresponding to the virtual models 3, 4, but as described above, it should be noted that a field parameter serving as a criterion of the ranges of the object physics fields 6, 7 may be not only a distance but also various parameters.

The kind or range of the field parameter may be fixedly maintained during physics simulation to a state which is preset before the physics simulation, or may also be flexibly changed depending on a relation with another associated physics field. Therefore, it should be understood that the kind and range of each field parameter may be set and modified in various ways by a user depending on physics simulation to be performed.

For example, in order to increase the frequency of physics simulation by which any virtual model reacts in association with another virtual model, the range of a physics field of the corresponding virtual model may be increased. In other words, by increasing or decreasing the range of a field, the probability of physics simulation according to an interaction between virtual models may be controlled.

In addition, in association with an interaction among a plurality of virtual models respectively having fields set as ranges of a plurality of field parameters, even though physics fields overlap each other with respect to any one field parameter, if the physics fields do not overlap each other with respect to another field parameter, the interaction between virtual models may be discounted.

Meanwhile, the object physics fields 6, 7 may also be preset to be activated or inactivated regardless of whether the object physics fields 6, 7 enter or deviate from the environmental physics field 5. For example, even though the corresponding virtual model is out of the environmental physics field 5 interested by a user, the virtual model may be included as a target for physics simulation if a certain condition is met. Therefore, it should be noted that the object physics fields 6, 7 are not always activated to perform the physics simulation only when the environmental physics field 5 and the object physics fields 6, 7 overlap.

If object physics fields of two or more virtual models correspond to each other or overlap each other in the environmental physics field 5, physics simulation is performed to the corresponding virtual models. Each of the virtual models has a mesh which is subject to physics simulation, and physics simulation may be performed thereto by calculating an interaction between the meshes.

Meanwhile, if object physics fields correspond to each other or overlap each other, this means that parameters serving as criteria of physics fields are identical to each other or of the same kind, or even though the parameters are different from each other, a corresponding relation is established between the ranges of the parameters.

At this time, physics simulation may be performed by adjusting a level of detail (LOD) of the mesh of the virtual model in real time. If a physics field of the virtual model does not overlap a physics field of another virtual model even though the physics field of the virtual model is activated so that the corresponding virtual model is subject to physics simulation, practical physics simulation to the corresponding virtual model may be simplified.

By reflecting this feature, the LOD of the mesh of the virtual model may be changed in real time according to a relation with another virtual model, which may enhance the efficiency or performance of physics simulation.

Figure 3A:
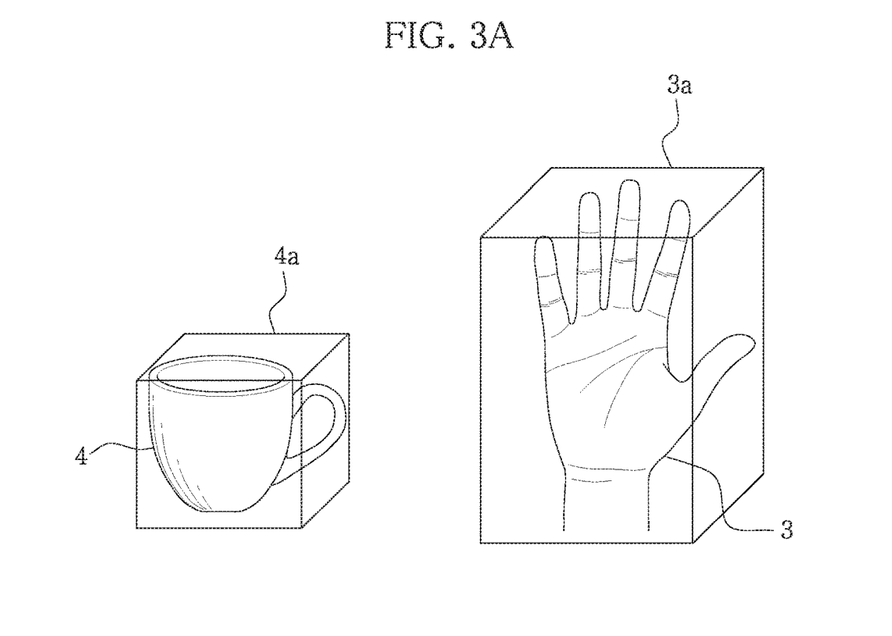
FIGS. 3A to 3C are schematic views showing meshes of objects which are different from each other depending on LOD.
Figure 3B:
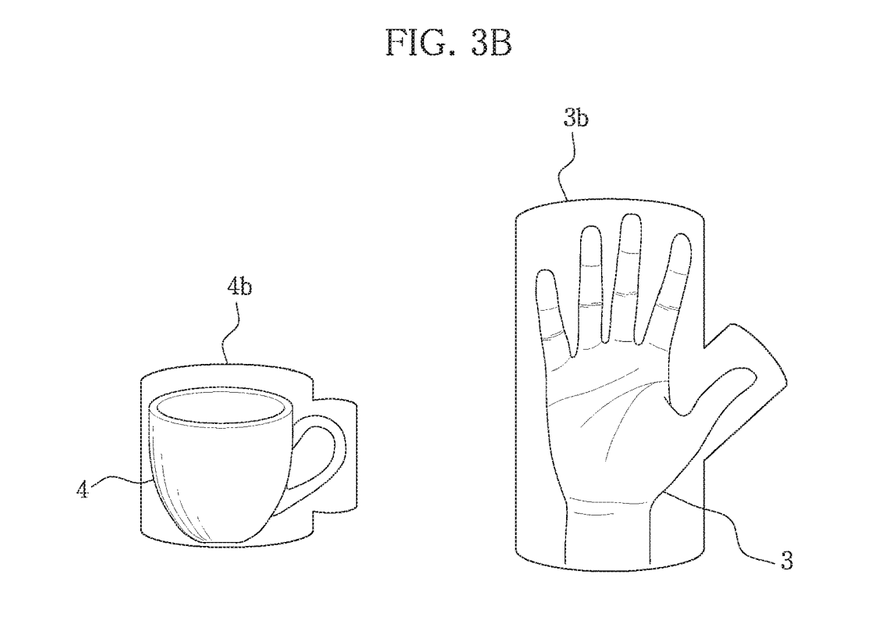
Figure 3C:
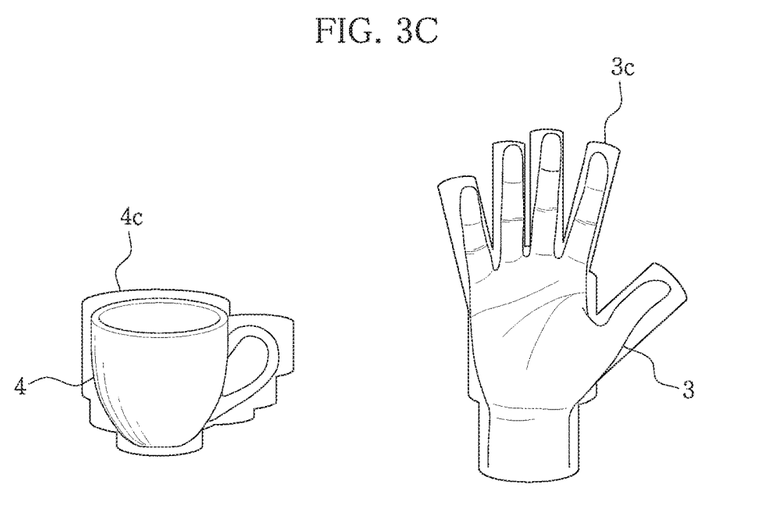

Referring to FIGS. 3A to 3C, meshes 3a to 3c and 4a to 4c of virtual models 3, 4 having different LODs may be found.

First, as shown in FIG. 3A, the virtual hand model 3 and the virtual cup model 4 may have a virtual hand mesh (a first mesh) 3a and a virtual cup mesh (a second mesh) 4a with a rectangular parallelepiped shape, respectively. If accurate physics simulation is not demanded to the virtual hand model 3 and the virtual cup model 4, the meshes 3a, 4a of the virtual models 3, 4 may be simplified as much as possible to reduce the amount of calculation accompanied by the physics simulation as small as possible.

In addition, as shown in FIG. 3B, the virtual hand model 3 and the virtual cup model 4 may respectively have a virtual hand mesh 3b and a virtual cup mesh 4b, which are more materialized in comparison to the meshes 3a, 4a in FIG. 3A. For example, in a situation where the probability of demanding accurate physics simulation with respect to the virtual hand model 3 and the virtual cup model 4 becomes higher, the meshes 3b, 4b of the virtual models 3, 4 may be modified as shown in FIG. 3B so that physics simulation may be performed more accurately later.

As shown in FIG. 3C, the virtual hand model 3 and the virtual cup model 4 may respectively have a virtual hand mesh 3c and a virtual cup mesh 4c, which are substantially similar to the original shapes of the virtual models 3, 4. In a situation where accurate physics simulation is demanded with respect to the virtual hand model 3 and the virtual cup model 4, the meshes 3c, 4c of the virtual models 3, 4 may be materialized as shown in FIG. 3C so that physics simulation may be performed more accurately.

The meshes of virtual models according to LOD may have any shape between a spherical shape which is a simplest form and a shape identical to a real object. LOD of a mesh distinguishable with respect to a single virtual model may be set using a suitable number of LODs, for example two or more LODs, depending on the physics simulation pattern of the corresponding virtual model. For example, a virtual model having only a relatively simple interaction may have meshes according to two LODs, and a virtual model having a relatively complicated interaction may have meshes according to many LODs, for example three or more LODs. The LODs of the meshes may be suitably selected by a user depending on a physics simulation pattern of an individual virtual model.

In addition, when a mesh is selected according to LOD, a sampling interval between nodes which compose the mesh may be adjusted so that a mesh according to each LOD is selected. For example, a mesh suitable for each LOD may be selected by adjusting an inter-node sampling interval smaller when the mesh is according to a high LOD and adjusting an inter-node sampling interval greater when the mesh is according to a low LOD.

Meanwhile, in case of the virtual models 3, 4 depicted in FIGS. 3A to 3C with their real shapes, physics simulation is performed in the form of meshes 3a to 3c and 4a to 4c on a virtual space, and they are depicted as being output with the real shapes only visually.

The shape of the mesh of the virtual model according to LOD may be determined in advance before physics simulation is performed, but the shape may be changed in real time according to a situation while physics simulation is being performed, thereby maximizing the efficiency of physics simulation.

Hereinafter, as a condition of changing the shape of a mesh while physics simulation is being performed, a process of changing a mesh according to the change of distance between virtual models and a process of changing a mesh according to complexity of virtual models will be described in detail.

Figure 4:
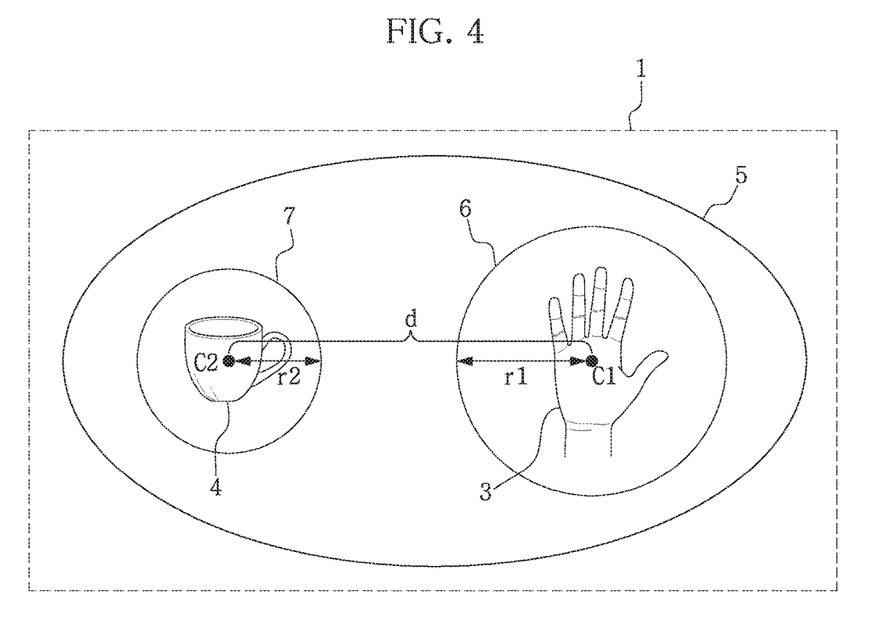
FIG. 4 is a schematic view showing a distance between center points of virtual models and radii of physics fields.

Referring to FIG. 4, the hand physics field 6 of the virtual hand model 3 has a circular shape with a radius r1 based on the center point C1 of the virtual hand model 3. In addition, the cup physics field 7 of the virtual cup model 4 has a circular shape with a radius r2 based on the center point C2 of the virtual cup model 4. A distance between the center point C1 of the virtual hand model 3 and the center point C2 of the virtual cup model 4 is represented as d.

Figure 5:
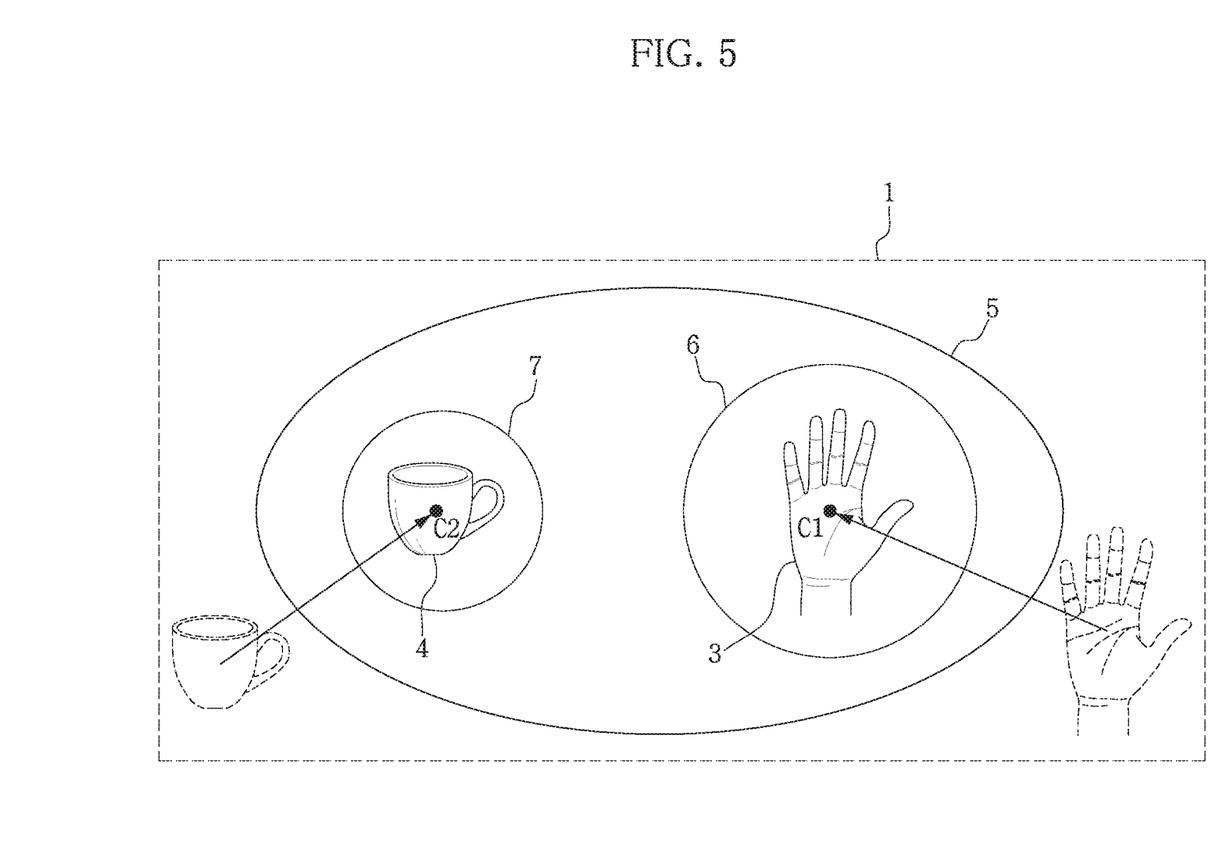
FIG. 5 shows that a physics field of a virtual model is activated as the virtual model enters an environmental physics field.

Referring to FIG. 5, it may be found that as the virtual hand model 3 and the virtual cup model 4 located out of the environmental physics field 5 enter the environmental physics field 5, respectively, the hand physics field 6 and the cup physics field 7 are activated. Since physics simulation is not performed out of the environmental physics field 5, meshes of the virtual models 3, 4 are not put into consideration. However, as the virtual models 3, 4 enter the environmental physics field 5 and thus their physics fields 6, 7 are activated, meshes of the virtual models 3, 4 are introduced for performing physics simulation.

Figure 6:
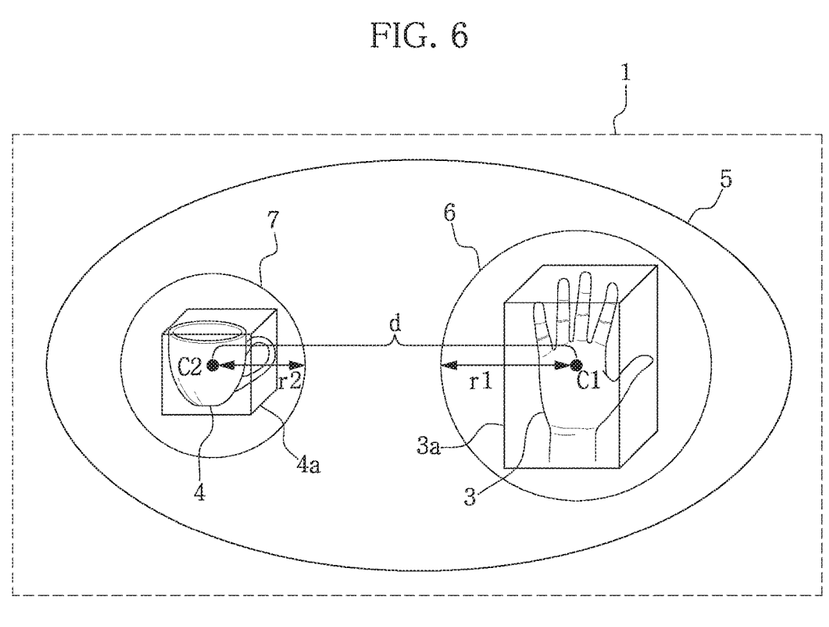
FIG. 6 shows meshes of virtual models, when physics fields do not overlap each other.

First, when meshes of the virtual models 3, 4 are determined, the distance d between the points C1, C2 of the virtual models 3, 4 may be considered. As shown in FIG. 6, if the hand physics field 6 and the cup physics field 7 do not overlap each other at all, namely if the distance d between the center points C1, C2 of the virtual models 3, 4 is greater than the sum of the radius r1 of the hand physics field 6 and the radius r2 of the cup physics field 7, it is regarded that there is no interaction between both virtual models 3, 4, and the mesh may be determined as having a simple shape according to low LOD. In this embodiment, it may be found that the hand physics field 6 and the cup physics field 7 respectively have a virtual hand mesh 3a and a virtual cup mesh 4a with a rectangular parallelepiped shape.

Figure 7:
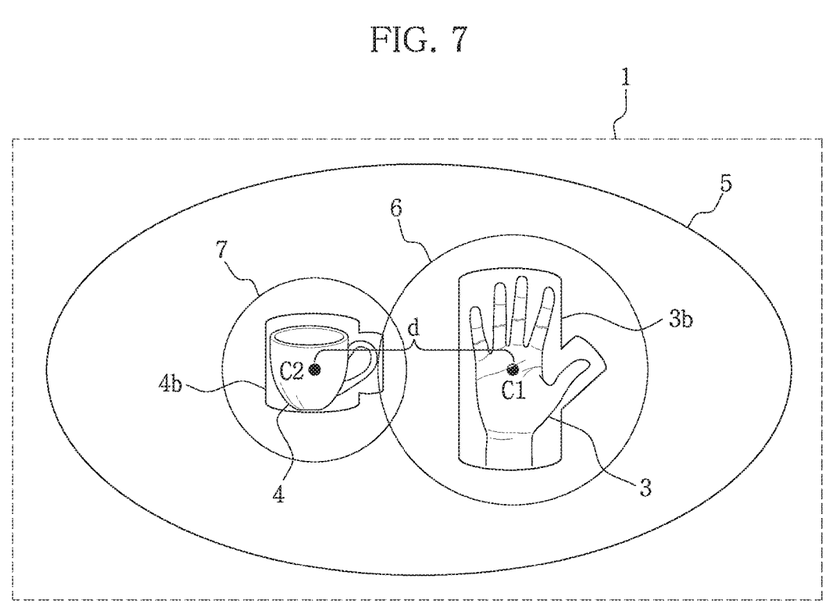
FIG. 7 shows meshes of virtual models, when physics fields overlap each other.

During physics simulation, if the virtual hand model 3 and the virtual cup model 4 become closer as shown in FIG. 7, an interaction occurs, or is highly likely to occur, between both virtual models 3, 4. Therefore, in comparison to the case of FIG. 6, it is required to materialize the meshes 3a, 4a of the virtual models 3, 4 more in order to enhance the accuracy of physics simulation.

In this embodiment, it is determined that a mesh according to medium LOD is required for physics simulation in a state where the hand physics field 6 and the cup physics field 7 initiate overlapping but both center points C1, C2 of the virtual models 3, 4 do not overlap the physics field 6 or 7.

In this case, namely if the distance d between the center points C1, C2 of the virtual models 3, 4 is smaller than the sum of the radius r1 of the hand physics field 6 and the radius r2 of the cup physics field 7 and becomes greater than a smaller one of the radii r1 and r2 of the physics fields 6, 7 during physics simulation, it is regarded that an interaction occurs, or is highly likely to occur, between both virtual models 3, 4, and so a mesh according to medium LOD may be determined. In this embodiment, it is depicted that the radius r2 of the cup physics field 7 is smaller than the radius r1 of the hand physics field 6, and it is set to have a mesh according to medium LOD even when the distance d between the center points C1, C2 is greater than the radius r2. Referring to FIG. 7, it may be found that the hand physics field 6 and the cup physics field 7 respectively have a virtual hand mesh 3b and a virtual cup mesh 4b having shapes slightly close to their real shapes as shown in the figure.

Figure 8:
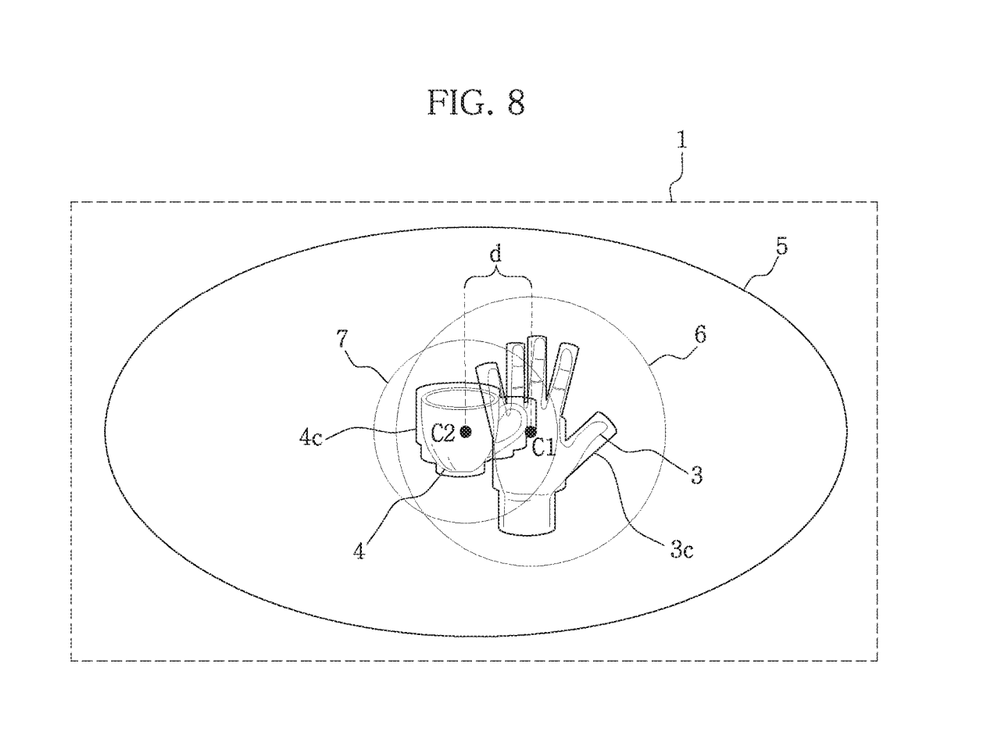
FIG. 8 shows meshes of virtual models, when physics fields overlap each other even for a center point thereof.

If the virtual hand model 3 and the virtual cup model 4 become considerably closer to each other as shown in FIG. 8 as physics simulation is performed, it may be regarded that an interaction occurs between the virtual models 3, 4 except for a special case. Therefore, in order to enhance the accuracy of physics simulation in comparison to the case of FIG. 7, it is required to materialize the meshes 3b, 3c of the virtual models 3, 4 as much as possible.

In this embodiment, if the center points C1, C2 of both virtual models 3, 4 overlap the physics field 6 or 7 of an opponent virtual model, it is determined that a mesh according to high LOD is required.

In other words, if the distance d between the center points C1, C2 of the virtual models 3, 4 becomes smaller than the radius r2 of the cup physics field 7, which is a relatively smaller radius, during physics simulation, it is regarded that an interaction occurs between the virtual models 3, 4, and so a mesh according to high LOD may be determined. Referring to FIG. 8, it may be found that the virtual hand model 3 and the virtual cup model 4 respectively have a virtual hand mesh 3c and a virtual cup mesh 4c having shapes substantially similar to their real shapes as shown in the figure.

As described above, physics simulation may be performed more efficiently by setting LODs demanded for the physics simulation according to a distance between the virtual models 3, 4 and changing the meshes 3a to 3c and 4a to 4c of the virtual models 3, 4 corresponding to each LOD.

When a mesh is determined corresponding to LOD which varies according to the change of distance, it is not needed to change meshes of all associated virtual models, and it is possible to simplify so that only meshes of partial virtual models are materialized.

LODS of virtual models may also be set according to complexity of the virtual models which are subject to physics simulation.

The virtual hand model 3 may perform various simulation motions from simple motions such as grasping, placing, pushing or the like to complicated motions such as assembling, dissembling or the like. In case of a simple motion, a simulation motion may be performed just with simple meshes among the meshes of the virtual hand model 3, but in case of a complicated motion, meshes having high LOD may be demanded among the meshes of the virtual hand model 3.

The complexity of each virtual model may be included as one of field parameters of the virtual model. If complexity ranges of virtual models correspond to each other, namely if physics fields of the virtual models with respect to complexity overlap each other, physics simulation may be performed after suitably modifying meshes of the virtual models.

It is possible to remove inefficiency caused by continuously using materialized meshes even though simulation may be performed in a simple way, and also a simulation motion may be performed accurately by selecting suitable meshes demanded according to complexity of virtual models.

A mesh of a virtual model for physics simulation may include characteristics according to various physics parameters. The mesh may include values of various parameters demanded for a motion which is to be implemented by physics simulation. A value corresponding to each parameter may be changed together when the mesh according to each LOD is changed as described above, and thus it should be understood that the inherent characteristics of a virtual model may be continuously maintained regardless of the change of the mesh.

The mesh according to LOD may be changed for various objects of each virtual model, but may also be changed for a single object of a virtual model. For example, if a motion to be implemented is performed just using a portion of a virtual model, meshes for the corresponding portion for performing the motion may be changed according to LOD as described, and meshes for a portion not associated with the motion may be maintained regardless of LOD.

Hereinafter, it will be described in detail that a shape of a mesh is changed while physics simulation is being performed.

As described above, when a mesh is changed according to LOD, if the mesh is abruptly changed at an instant, physics simulation may be unnaturally performed and also an error may occur. Therefore, even though it is determined to change the mesh, a mesh before the change and a mesh after the change may be softly connected within a suitable range to perform the physics simulation more naturally.

Figure 9:
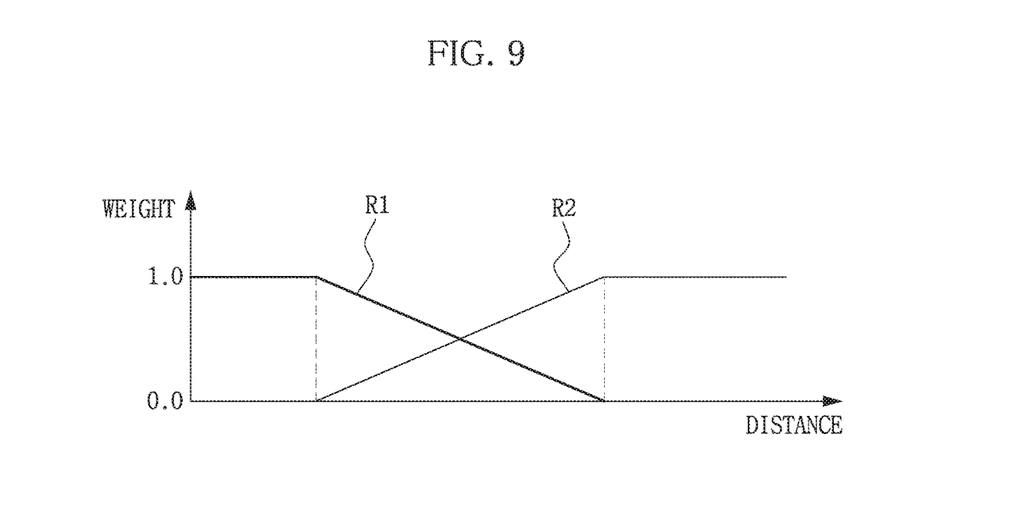
FIG. 9 is a graph showing the change of a weight with respect to a mesh parameter depending on the change of distance between virtual models.

FIG. 9 is a graph showing the change of a weight of a mesh parameter between states before and after the change of mesh depending on the change of distance between two virtual models. If it is assumed that a distance between two virtual models is gradually increasing, a parameter before the mesh is changed is represented as R1, and a parameter after the change is represented as R2.

As the mesh is changed, a parameter during a transition region may be successively changed by means of weights W1, W2 with respect to the parameters before and after the change, respectively. The mesh parameter Rb during the transition region may be expressed as Equation 1 below.

$$Rb = R1 \times W1 + R2 \times W2 \quad \text{[Equation 1]}$$

In case of the parameter R1 before the change, as virtual models become farther from each other, the weight gradually decreases from 1 to 0. On the contrary, in case of the parameter R2 after the change, as virtual models becomes farther from each other, the weight gradually increases from 0 to 1. As a result, with a predetermined distance, the mesh parameter Rb during the transition region is softly changed from R1 to R2.

Figure 10:
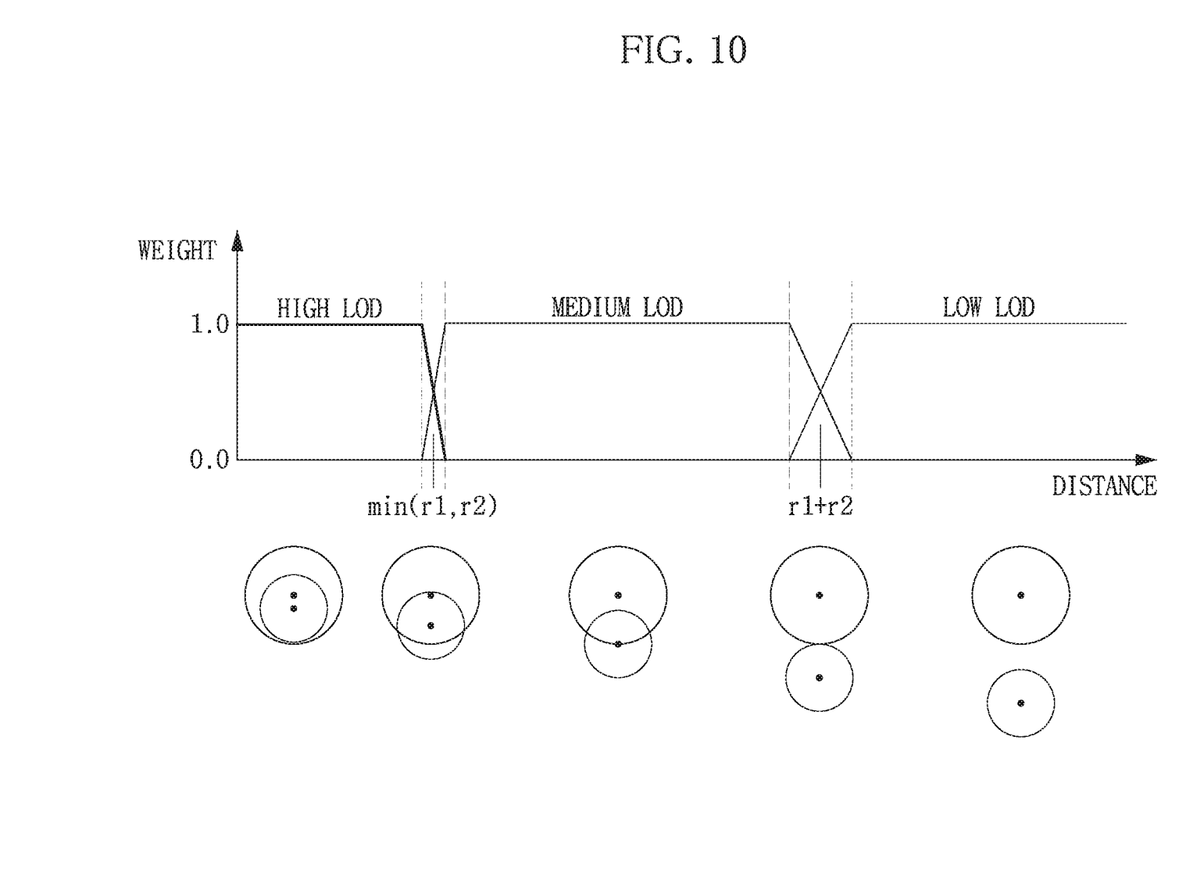
FIG. 10 is a graph showing the change of a weight with respect to a mesh parameter at each LOD depending on the change of distance between virtual models.

While the mesh is being changed, unnatural simulation caused by abrupt changes may be relieved by applying a value obtained by adding values calculated by multiplying the parameter before change and the parameter after change by the weights, respectively. The change of weight applied for soft transition when changing the mesh according to each LOD depending on the change of distance between virtual models is depicted in FIG. 10 as a graph.

Meanwhile, the length of the transition region may be suitably selected in consideration of natural connection before and after the change as well as simulation efficiency.

Hereinafter, a method of controlling virtual models based on the above features in controlling virtual models will be described.

Figure 11:
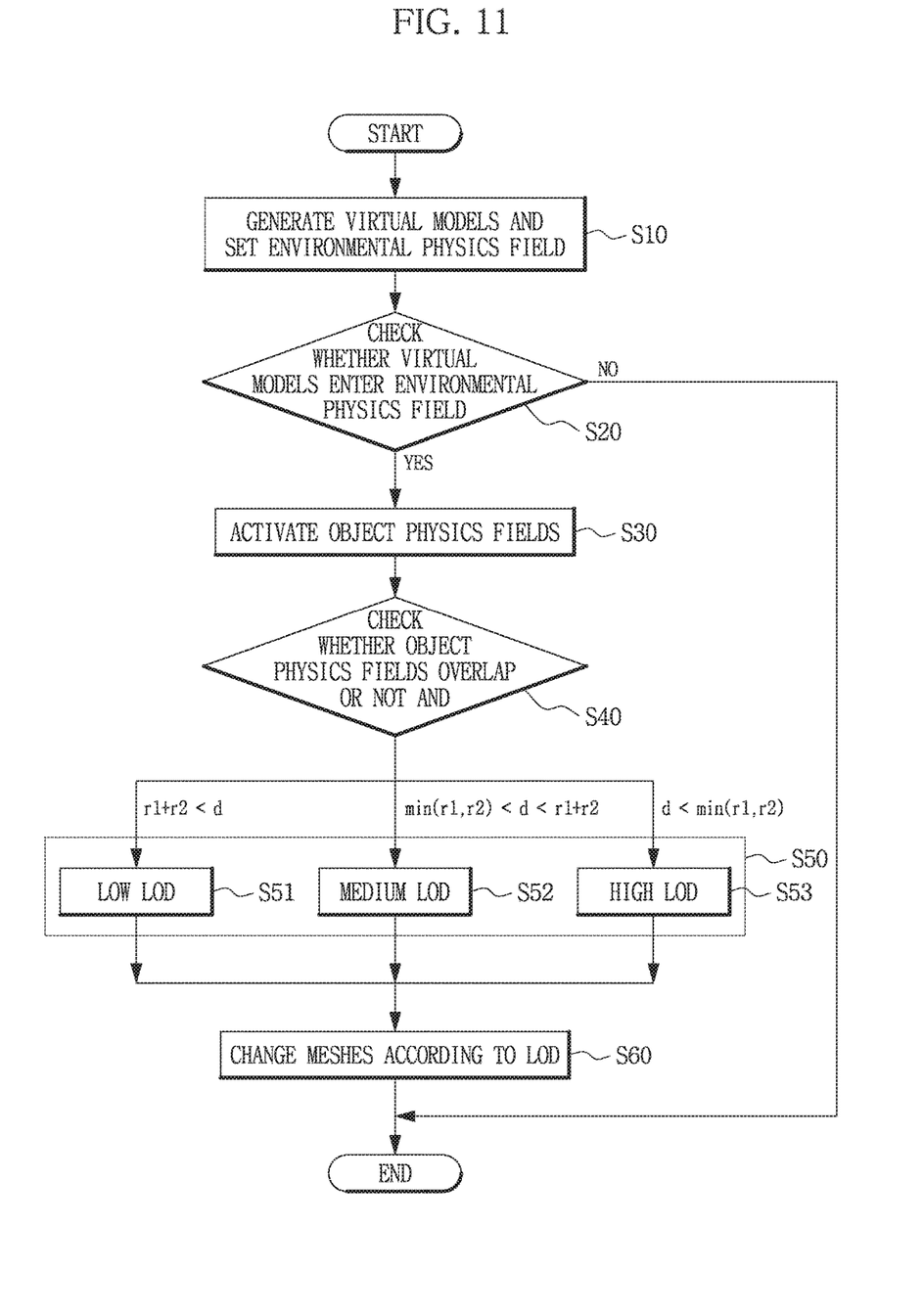
FIG. 11 is a flowchart for illustrating each step of a method of controlling a virtual model according to an embodiment of the present disclosure, which determines LOD of meshes of virtual models.

Referring to FIG. 11, a method controlling virtual models according to an embodiment of the present disclosure includes generating virtual models and setting an environmental physics field (S10), checking whether the virtual models enter the environmental physics field (S20), activating object physics fields (S30), checking whether or not the object physics fields overlap and checking the degree of overlapping (S40), determining LOD of meshes (S50), and changing the meshes according to LOD (S60).

First, virtual models are generated in a virtual space, and an environmental physics field to which physics simulation is to be performed is set (S10). The virtual models respectively have object physics fields according to ranges of their field parameters.

The object physics fields of the virtual models may also be set so as to be activated as the virtual models enter the environmental physics field. By doing so, when the virtual models enter the environmental physics field, physics simulation may be performed to the virtual models. In addition, the environmental physics field may also be set to be movable and modifiable.

Each of the virtual models may be generated to have a plurality of object physics fields. In other words, any virtual model may have a plurality of object physics fields according to ranges of a plurality of field parameters.

At this time, when physics simulation is performed, in case some parameters correspond to each other and thus object physics fields overlap each other, if the other field parameters do not correspond to each other, or if the object physics fields do not overlap each other even though the other field parameters correspond to each other, an interaction may not be generated between the virtual models.

Similarly, priorities may be set to object physics fields so that LOD of a mesh may be determined according to whether object physics fields having high priority overlap each other.

The field parameter may be set as a distance from a center point of each virtual model. At this time, the object physics fields correspond to a space located from the center points of the virtual models to a maximum distance.

A field parameter of any virtual model may be set as complexity required for moving the virtual model. In addition, a field parameter of another virtual model may be set as complexity of an available motion of the virtual model.

Meanwhile, each of the virtual models may be set to have a mesh selected among one or more meshes corresponding to one or more LOD. For example, any virtual model includes a simple rectangular parallelepiped shape, a shape substantially identical to its original shape, and a shape between them, to have three kinds of meshes according to low LOD, high LOD and medium LOD, respectively. The virtual model is determined to have any one of three meshes depending on the determination on the object physics field during physics simulation.

Meshes of virtual models may be set to be closer to the original shapes of the virtual models as LOD is higher. In addition, LOD may be determined higher when there is an overlapping portion between the physics fields, rather than in a case where there is no overlapping portion between the physics fields. Moreover, as an overlapping portion between the object physics fields is greater, LOD may be set higher.

Next, it is checked whether the virtual models enter the environmental physics field (S20). It is periodically checked at regular intervals whether a virtual model out of the environmental physics field enter the environmental physics field, or whether a virtual model environmental physics field deviates from the environmental physics field.

It may be checked that the virtual model enters the environmental physics field only when the virtual model enters the environmental physics field entirely, but it is also possible to check that the virtual model enters the environmental physics field even though the virtual model enters the environmental physics field just partially.

After that, the object physics fields of the virtual models entering the environmental physics field are activated (S30), and the object physics fields of the virtual models out of the environmental physics field are inactivated. By doing so, physics simulation may be performed only to the virtual models within the environmental physics field.

By using the activated object physics fields, it is checked whether there is an overlapping portion between the object physics fields, and if there is an overlapping portion, it is checked how much they overlap each other (S40).

Checking an overlapping portion between object physics fields may be performed only for object physics fields having field parameters corresponding to each other. For example, if the field parameters are parameters for a distance or space, they may correspond to each other. In addition, if a field parameter of any one virtual model is complexity required for moving the virtual model and a field parameter of another virtual model is complexity of an available motion of the virtual model, two parameters may correspond to each other.

After that, LOD of the meshes are determined in consideration of the overlapping portion between the object physics fields (S50). LOD of meshes according to the overlapping of the object physics fields and the degree of overlapping may be set by a user to be suitable for performing physics simulation.

In this embodiment, LOD is determined according to the degree of overlapping between the object physics fields which are set with respect to a distance from the center points of the virtual models. As shown in the figures, if the distance between the center points is greater than the sum of radii of the object physics fields, LOD is determined to be low (S51), if the distance between the center points is smaller than the sum of radii of the object physics fields and greater than a smaller one of both radii, LOD is determined to be medium LOD (S52), and if the distance between the center points is smaller than a smaller one of two radii, LOD is determined to be high (S53).

After that, according to LOD determined in Step S50, the meshes of the virtual models are changed (S60). By using the changed meshes, an interaction of the virtual models is generated, and physics simulation is performed.

At this time, the mesh parameter during the transition region may be adjusted by means of a weight so that the mesh parameter is continuously changed according to the change of the mesh. For example, the mesh parameter during the transition region may be set as a value calculated by adding a value obtained by multiplying a mesh parameter before the change by a gradually decreasing weight and a value obtained by multiplying a mesh parameter after the change by a gradually increasing weight.

At this time, the length of the transition region may be suitably selected, and is set to be within the following range in this embodiment.

transition between low LOD and medium LOD: $0.95 \times (r1+r2) < |d| < 1.05 \times (r1+r2)$ transition between medium LOD and high LOD: $0.95 \times \min(r1, r2) < |d| < 1.05 \times \min(r1, r2)$ As described above, if the method of controlling a virtual model according to an embodiment of the present disclosure is used, the amount of calculation demanded for physics simulation is greatly reduced to improve the simulation efficiency, and may be applied to various kinds of physics engines since it is used as a preprocessing means for the physics simulation regardless of the kind of the physics engine.

The computer-readable recording medium according to embodiments of the present disclosure may include commands for executing the method of controlling a virtual model as described above, as a processor in an electronic device, in order to perform physics simulation to a virtual model in a virtual space. The embodiments of the present disclosures may be implemented as program commands executable through various computer components and recorded on a computer-readable recording medium.

The computer-readable recording medium may include program commands, data files, data structures or the like solely or in combination. The program commands recorded on the medium may be specially designed or configured for the present disclosure or known to and available by computer software engineers. The computer-readable recording medium includes, for example, magnetic media such as a hard disk, a floppy disk and a magnetic tape, optical media such as CD-ROM and DVD, magneto-optical media such as a floptical disk, hardware devices such as ROM, RAM and a flash memory, specially configured to store and perform program commands, or the like.

The program commands include not only machine codes made by a complier but also high-level language codes executable by a computer by using an interpreter. The hardware device may be configured to operate as at least one software module to perform the operations of the present disclosure, or vice versa.

The embodiments of the present disclosure have been described in detail with reference to the accompanying drawings, but the present disclosure is not limited to the embodiments but may be modified in various ways without departing from the scope of the present disclosure. Therefore, the embodiments in the present disclosure are not intended to limit the scope of the present disclosure but intended for illustration, and the scope of the present disclosure is not limited to the embodiments. Therefore, the embodiments described above should be understood as being illustrative in all aspects, rather than restrictive. The scope of the present disclosure to be protected should be interpreted based on the appended claims, and all equivalents thereof should be understood as falling within the scope of the present disclosure.

What is claimed is:

1. A non-transitory computer-readable recording medium, which comprises commands for executing a method of controlling a virtual model as a processor in an electronic device to perform physics simulation of the virtual model in a virtual space, the method comprising:
    generating a first virtual model having a first object physics field defined at least partly in terms of at least one first field parameter which determines whether or not to perform simulation of interaction of the first virtual model with another virtual model based on a range assigned to the at least one first field parameter;
    generating a second virtual model having a second object physics field defined at least partly in terms of at least one second field parameter which determines whether or not to perform simulation of interaction of the second virtual model with another virtual model based on a range assigned to the at least one second field parameter;
    when the at least one first field parameter and the at least one second field parameter are capable of corresponding to each other, checking whether there is a portion where the first and second object physics fields correspond to each other; and
    when there is a portion where the first and second object physics fields correspond to each other, generating an interaction of the first and second virtual models;
    wherein meshes of the first and second virtual models are selected from at least one mesh corresponding to at least one preset level of detail (LOD),
    wherein the method further comprises changing a mesh of at least one of the first or the second virtual models according to a LOD which is determined in consideration of the portion where the first and second object physics fields overlap each other,
    wherein the at least one first field parameter and the at least one second field parameter are respective distances from respective center points of the first and the second virtual models,
    wherein the first and the second object physics fields are further defined at least partly by respective spaces located from the respective center points of the first and the second virtual models to a maximum distance,
    wherein the meshes of the first and second virtual models are closer to an original shape of the first and second virtual models as the LOD is higher, and
    wherein the LOD is determined to be higher as a portion where the first and second object physics fields overlap each other is greater.

2. The non-transitory computer-readable recording medium according to claim 1,
    wherein the LOD is determined to be higher when there is the portion where the first and second object physics fields overlap each other, in comparison to a case where there is no portion where the first and second object physics fields overlap each other.

3. The non-transitory computer-readable recording medium according to claim 1,
    wherein another first field parameter is complexity of simulation resulting by moving the first virtual model, and
    wherein another second field parameter is complexity of simulation of an available motion of the second virtual model.

4. The non-transitory computer-readable recording medium according to claim 1,
    wherein the first virtual model has a plurality of first object physics fields and a corresponding plurality of first field parameters,
    wherein the second virtual model has a plurality of second object physics fields and a corresponding plurality of second field parameters, and
    wherein a priority is set to each of the plurality of first object physics fields and the plurality of second object physics fields, so that the LOD is determined according to overlapping of object physics fields of the plurality of first object physics fields and the plurality of second object physics fields having a high priority.

5. The non-transitory computer-readable recording medium according to claim 1,
    wherein an environmental physics field for performance of physics simulation is set in the virtual space, and
    wherein as the first and second virtual models enter the environmental physics field, each of the first and second object physics fields is activated to allow physics simulation with respect to the first and second virtual models.

6. The non-transitory computer-readable recording medium according to claim 5,
    wherein the environmental physics field is movable and modifiable.

7. The non-transitory computer-readable recording medium according to claim 1, wherein the at least one mesh comprises a mesh parameter demanded for a motion which is to be implemented by physics simulation, and wherein during a transition where the at least one mesh is changing according to LOD, the mesh parameter is calculated by adding a value obtained by multiplying the mesh parameter before the changing by a gradually decreasing weight and a value obtained by multiplying the mesh parameter after the changing by a gradually increasing weight.

8. The non-transitory computer-readable recording medium according to claim 1, wherein the first virtual model has a plurality of first object physics fields defined at least partly in terms of a plurality of first field parameters, wherein the second virtual model has a plurality of second object physics fields defined at least partly in terms of a plurality of second field parameters, and wherein in case a part of the first field parameters and a part of the second field parameters correspond to each other and thus ones of the plurality of first object physics fields and the plurality of second object physics fields overlap each other, when another part of the first field parameters and another part of the second field parameters do not correspond to each other, or when the plurality of first object physics fields and the plurality of second object physics fields do not overlap each other even though the other part of the first field parameters and the other part of the second field parameters correspond to each other, an interaction of the virtual models is not generated.

9. A system of controlling a virtual model to perform physics simulation of the virtual model in a virtual space, the system comprising at least one processor configured to execute program commands to implement:

a virtual model generating module configured to generate a virtual model having an object physics field defined at least partly in terms of at least one field parameter which determines whether or not to perform simulation of interaction of the virtual model with another virtual model based on a range assigned to the at least one field parameter;

a field checking module configured to check whether there is a portion where a plurality of object physics fields of corresponding field parameters correspond to each other; and an interaction generating module configured to generate an interaction of a plurality of virtual models, wherein the virtual model generating module generates a first virtual model having a first object physics field defined at least partly in terms of a first field parameter and a second virtual model having a second object physics field defined at least partly in terms of a second field parameter, and wherein when the first and the second field parameters are capable of corresponding to each other and a portion where the first and the second object physics fields correspond to each other is checked by means of the field checking module, the interaction generating module generates an interaction of the first and the second virtual models;

wherein meshes of the first and second virtual models are selected from at least one mesh corresponding to at least one preset level of detail (LOD), wherein the method further comprises changing a mesh of at least one of the first or the second virtual models according to a LOD which is determined in consideration of the portion where the first and second object physics fields overlap each other, wherein the at least one first field parameter and the at least one second field parameter are respective distances from respective center points of the first and the second virtual models, wherein the first and the second object physics fields are further defined at least partly by respective spaces located from the respective center points of the first and the second virtual models to a maximum distance, wherein the meshes of the first and second virtual models are closer to an original shape of the first and second virtual models as the LOD is higher, and wherein the LOD is determined to be higher as a portion where the first and second object physics fields overlap each other is greater.

10. A method of controlling a virtual model to perform physics simulation of the virtual model in a virtual space, comprising:

generating a first virtual model having a first object physics field defined at least partly in terms of at least one first field parameter which determines whether or not to perform simulation of interaction of the first virtual model with another virtual model based on a range assigned to the at least one first field parameter;

generating a second virtual model having a second object physics field defined at least partly in terms of at least one second field parameter which determines whether or not to perform simulation of interaction of the second virtual model with another virtual model based on a range assigned to the at least one second field parameter;

when the at least one first field parameter and the at least one second field parameter are capable of corresponding to each other, checking whether there is a portion where the first and second object physics fields correspond to each other; and when there is a portion where the first and second object physics fields correspond to each other, generating an interaction of the first and second virtual models;

wherein meshes of the first and second virtual models are selected from at least one mesh corresponding to at least one preset level of detail (LOD), wherein the method further comprises changing a mesh of at least one of the first or the second virtual models according to a LOD which is determined in consideration of the portion where the first and second object physics fields overlap each other, wherein the at least one first field parameter and the at least one second field parameter are respective distances from respective center points of the first and the second virtual models, wherein the first and the second object physics fields are further defined at least partly by respective spaces located from the respective center points of the first and the second virtual models to a maximum distance, wherein the meshes of the first and second virtual models are closer to an original shape of the first and second virtual models as the LOD is higher, and wherein the LOD is determined to be higher as a portion where the first and second object physics fields overlap each other is greater.

* * * * *